United States Patent [19]

Cha

[11] Patent Number: 5,428,248
[45] Date of Patent: Jun. 27, 1995

[54] RESIN MOLDED SEMICONDUCTOR PACKAGE

[75] Inventor: Gi Bon Cha, Euiwang, Rep. of Korea

[73] Assignee: Goldstar Electron Co., Ltd., Rep. of Korea

[21] Appl. No.: 290,398

[22] Filed: Aug. 15, 1994

Related U.S. Application Data

[63] Continuation of Ser. No. 109,227, Aug. 19, 1993, abandoned.

[30] Foreign Application Priority Data

Aug. 21, 1992 [KR] Rep. of Korea ............... 15766/1992

[51] Int. Cl.⁶ ............... H01L 23/48; H01L 29/40; H01L 29/44
[52] U.S. Cl. ............... 257/676; 257/692; 257/698; 257/787
[58] Field of Search ............... 257/666, 667, 679, 676, 257/787, 788, 796, 692, 698

[56] References Cited

U.S. PATENT DOCUMENTS

| 5,122,860 | 6/1992 | Kikuchi et al. | 257/679 |
| 5,172,214 | 12/1992 | Casto | 257/676 |
| 5,235,207 | 8/1993 | Ohi et al. | 257/670 |
| 5,250,841 | 10/1993 | Sloan et al. | 257/666 |

FOREIGN PATENT DOCUMENTS

| 60-160639 | 8/1985 | Japan | 257/787 |
| 61-105808 | 11/1987 | Japan | 257/787 |
| 63-296252 | 12/1988 | Japan | 257/66 |
| 4-129252 | 4/1992 | Japan | 257/788 |

*Primary Examiner*—Jerome Jackson
*Assistant Examiner*—Donald L. Monin, Jr.
*Attorney, Agent, or Firm*—Scully, Scott, Murphy & Presser

[57] ABSTRACT

A resin molded semiconductor package of which the semiconductor chip is bonded to leads instead of a paddle. This package comprises a semiconductor chip and a lead frame comprising a plurality of board connection leads and a plurality of chip connection leads. The board connection leads are connected to a circuit board and support the semiconductor chip bonded to their surfaces. The chip connection leads extend from individual board connection leads and are electrically connected to the semiconductor chip through a plurality of metal wires. A pair of chip bonding materials bond the semiconductor chip to the surfaces of the board connection leads. A predetermined volume of the package, including the semiconductor chip and the board connection leads and the chip connection leads, is hermetically sealed by a mold resin to form a package body in which the lower surfaces of the board connection leads are exposed to the outside of the lower surface of the package body. The chip bonding material is selected from an insulating double-faced tape and an insulating adhesive of the paste type.

10 Claims, 2 Drawing Sheets

RESIN MOLDED SEMICONDUCTOR PACKAGE

This is a continuation of application Ser. No. 109,227 filed on Aug. 19, 1993, now abandoned.

BACKGROUND OF THE INVENTION

1. Field of the Invention

The present invention relates in general to a semiconductor package, and more particularly to a resin molded semiconductor package of which a predetermined volume is hermetically sealed by a mold resin to form a package body.

2. Background of the Prior Art

With reference to FIGS. 1 and 2, there are shown a small outline J-lead package and a small outline package in accordance with the prior art, respectively. Each of the semiconductor packages of the prior art comprises a semiconductor chip 1 having a predetermined shape and mounted on a paddle 2 of a lead frame. The lead frame further comprises a plurality of inner leads 3, connected to the semiconductor chip 1 through a plurality of metal wires 5 which will be described later herein, and a plurality of outer leads 4 outwardly extending from individual inner leads 3. The semiconductor chip 1 is electrically connected to the inner leads 3 of the lead frame through the plurality of metal wires 5. In the known package, a predetermined volume including the semiconductor chip 1 and the inner leads 3 electrically connected to the chip 1 is packaged or hermetically sealed by a mold resin 6 to form a package body.

In the drawings, the reference numeral 7 denotes chip bonding material for bonding the semiconductor chip 1 to the surface of the paddle 2 of the lead frame.

FIG. 3 shows in a plan view a structure of a conventional lead frame of the semiconductor package. As shown in this drawing, the paddle 2 of the lead frame is supported by a pair of connection bars 9 and 9' which connect the opposite ends of the paddle 2 to an opposed pair of side rails 8 and 8', respectively. The plurality of inner leads 3 and the plurality of outer leads 4 are integrally formed with each other and arranged on opposite sides of the paddle 2. Each of the leads, comprising an inner lead 3 and an outer lead 4, is connected to the other leads and supported by dambars 10.

In order to assembly the semiconductor package having the construction described above, the semiconductor chip 1 which is provided by sawing the wafer is first bonded to the surface of the paddle 2 of the lead frame using the chip bonding material 7. The lead frame having the semiconductor chip 1 bonded to the surface of the paddle 2 is, thereafter, subjected to a high temperature curing so as to cure the bonding material 7.

Thereafter, a wire bonding step is carried out to electrically connect the inner leads 3 of the lead frame to individual bond pads of the semiconductor chip 1 using the metal wires 5, such as gold wires or aluminum wires.

Upon finishing the wire bonding step, the predetermined volume including the semiconductor chip 1 and the inner leads 3 of the lead frame is hermetically sealed by the mold resin 6 to form the package body. Thereafter, the remnant of the mold resin 6 is removed from the package body prior to plating of the outer leads 4 of the lead frame using tin and lead.

After the plating of the outer leads 4, a trimming step and a forming step are carried out in series. In the trimming step, the dambars 10 connecting the leads to each other and the connection bars 9 and 9' connecting the paddle 2 to the side rails 8 and 8' are cut off to separate the packages from each other. In the forming step, the outer leads 4 of the lead frame protruding out of the package body are bent to a predetermined bent shape, thereby preparing a desired semiconductor package such as shown in FIG. 1 or 2. The known semiconductor packages are conventionally classified into several types in accordance with the bent shape of the outer leads 4 of the lead frame. Otherwise stated, the known semiconductor packages are generally classified into a small outline J-lead package such as shown in FIG. 1, a small outline package (SOP) package such as shown in FIG. 2 and a dual inline package (not shown).

The semiconductor packages prepared by the process described above should be subjected to an electric performance test prior to practical use. In practical use, the semiconductor package is mounted on a printed circuit board (not shown) by a surface mounting technique or an insert mounting technique and gives its predetermined function to an electronic equipment provided with it.

However, each of the known semiconductor packages requires a substantial mounting area on the printed circuit board due to its outer leads protruding out of the package body while there is some difference in the mounting area in accordance with the types of the semiconductor packages. Thus, each of the known semiconductor packages has a problem that it causes deterioration of space efficiency of the printed circuit board and this results in deterioration of package mounting efficiency. Another problem of the known semiconductor packages is that the outer leads are apt to be undesirably bent when the packages are mounted on the printed circuit board or transported, thereby causing quality inferiority.

In addition, since the metal paddle of the lead frame is different in the thermal expansion coefficient from the semiconductor chip, so that the known semiconductor package is easily broken during its mounting on the printed circuit board and there easily occurs separation of the interface between the semiconductor chip and the metal paddle. Furthermore, the preparation process of the known semiconductor package comprises several complex steps and this causes increase of manufacturing cost of the packages as well as installation cost of the package manufacturing equipment. The outer leads protruding out of the package body may result in deterioration of lead contact during the electric performance test, thus deteriorating limit of error of the testing.

SUMMARY OF THE INVENTION

It is, therefore, an object of the present invention to provide a resin molded semiconductor package in which the aforementioned problems can be overcome and which requires minimum mounting area on the printed circuit board and prevents its outer leads from being undesirably bent and prevents breakage of its package body during its mounting on the printed circuit board.

It is another object of the present invention to provide a resin molded semiconductor package which requires no forming step in its preparation process, thereby simplifying the preparation process and reducing the manufacturing cost of the packages as well as installation cost of the package manufacturing equipment.

To accomplish the above object, the present invention provides a resin molded semiconductor package comprising a semiconductor chip having a predetermined shape; a lead frame comprising a plurality of board connection leads and a plurality of chip connection leads, the board connection leads being connected to a circuit board and supporting the semiconductor chip bonded to their surfaces, the chip connection leads extending from individual board connection leads and being electrically connected to the semiconductor chip through a plurality of metal wires; an adhesive for attaching the semiconductor chip to the surfaces of the board connection leads; the plurality of metal wires electrically connecting a plurality bond pads of the semiconductor chip to the chip connection leads of the lead frame, respectively; and a mold resin hermetically sealing a predetermined volume of the package, including the semiconductor chip and the board connection leads and the chip connection leads, to form a package body such that the lower surfaces of the board connection leads are leveled with the lower surface of the package body. Thus, the lower surfaces of the board connection leads are exposed to the outside of the lower surface of the package body.

Here, a down-set of a predetermined depth is given to the board connection leads of the lead frame, each of the chip connection leads of the lead frame is provided about a periphery of the package body with an opposed pair of V-shaped cutting slots for causing an unnecessary part of the chip connection lead to be easily cut off, and the board connection leads and the chip connection leads are arranged between an opposed pair of side rails at regular intervals and supported by dambars.

The adhesive is selected from an insulating double-faced tape and an insulating adhesive of the paste type.

In the same manner as the conventional semiconductor packages, the semiconductor package is subjected to an electric performance test prior to its practical use. In practical use, the semiconductor package is mounted on a printed circuit board by a surface mounting technique or an insert mounting technique and gives its predetermined function to an electronic equipment in such a manner that data of the semiconductor chip is transmitted to the circuit board through the metal wires and the board connection leads of the lead frame.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
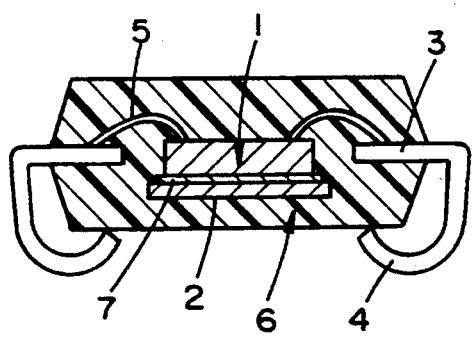
FIG. 1 is a sectional view of a resin molded semiconductor package of the small outline J-lead type in accordance with the prior art.
Figure 2:
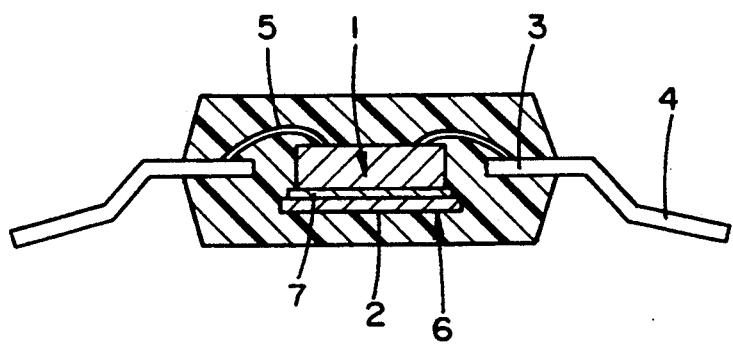
FIG. 2 is a sectional view of a resin molded semiconductor package of the small outline type in accordance with the prior art.
Figure 3:
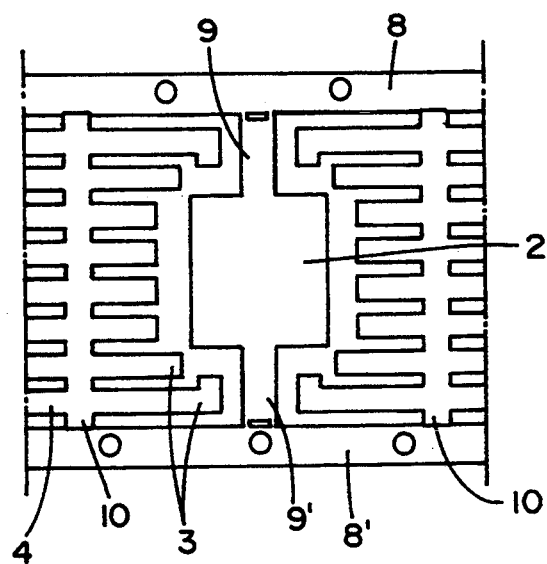
FIG. 3 is a plan view showing a structure of a lead frame of a known resin molded semiconductor package.
Figure 4:
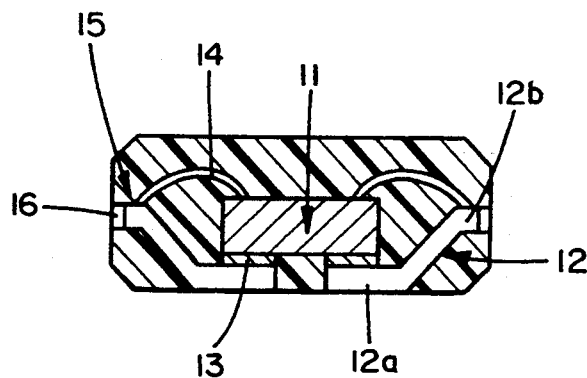
FIG. 4 is a sectional view of a resin molded semiconductor package in accordance with a primary embodiment of the present invention.
Figure 5:
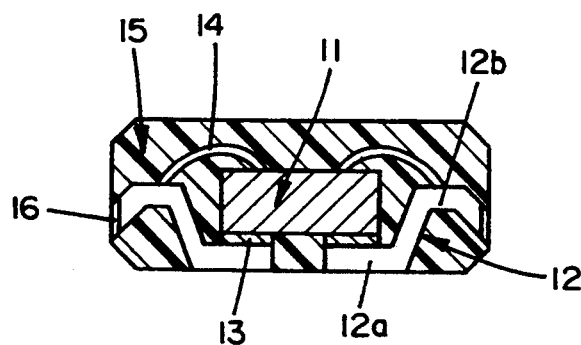
FIG. 5 is a sectional view of a resin molded semiconductor package in accordance with a second embodiment of the present invention.
Figure 6:
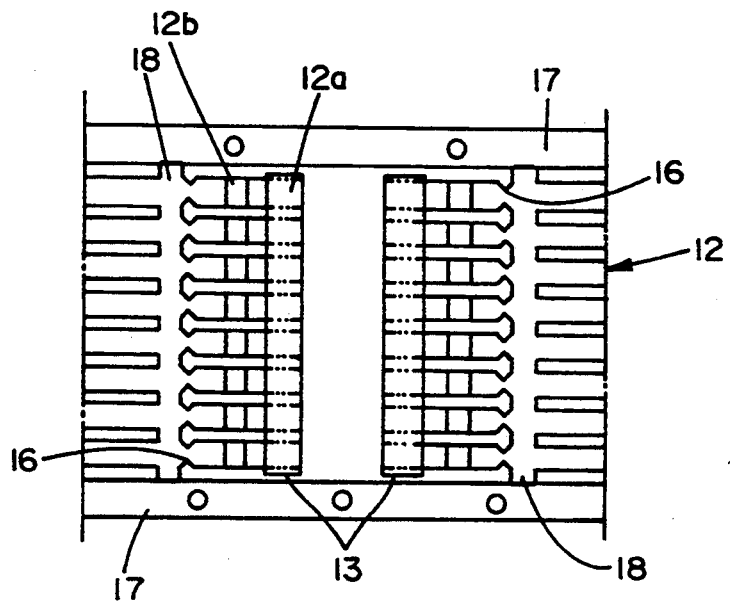
FIG. 6 is a plan view showing a structure of a lead frame of a resin molded semiconductor package of the present invention.

With reference to the drawings, FIGS. 4 and 5 show resin molded semiconductor packages in accordance with a primary embodiment and with a second embodiment of the present invention, respectively, and FIG. 6 shows in a plan view a structure of a lead frame of the resin molded semiconductor package of the present invention.

As shown in these drawings, the semiconductor package of the present invention includes a semiconductor chip 11 having a predetermined shape. The lead frame 12 of this package comprises a plurality of board connection leads 12a and a plurality of semiconductor chip connection leads 12b. The board connection leads 12a support the semiconductor chip 11 bonded to their surfaces and are connected to a circuit board (not shown). The chip connection leads 12b extend from the board connection leads 12a, respectively, and are electrically connected to the semiconductor chip 11 by a plurality of metal wires 14. Bonding of the semiconductor chip 11 on the surfaces of the board connection leads 12a of the lead frame 12 is achieved by a pair of chip bonding materials 13. A plurality of bond pads of the semiconductor chip 11 are electrically connected to the chip connection leads 12b of the lead frame through the plurality of metal wires 14, respectively. In the semiconductor package of this invention, a predetermined volume including the semiconductor chip 11 and the board connection leads 12a and the chip connection leads 12b of the lead frame is hermetically sealed by a mold resin 15 to form a package body. When the packaged body is formed, the lower surfaces of the board connection leads 12a are leveled with the lower surface of the package body and exposed to the outside of the lower surface of the package body.

A down-set of predetermined depths ranged from 8 to 50 mils is given to the board connection leads 12a of the lead frame 12.

In the primary embodiment of FIG. 4, the chip connection leads 12b of the lead frame are horizontally formed. However, in the second embodiment of FIG. 5, they are bent downwardly to show a reversed U-shaped section. Because of the reversed U-shaped section of each of the leads 12b, the second embodiment prevents the leads 12b from being moistened during a package body molding step. In addition, the semiconductor package according to this second embodiment increases the contact surface between the leads 12 and the mold resin 15, so that it reduces the mechanical stress during the molding step.

Each of the chip connection leads 12b of the lead frame 12 is provided at the periphery of the package body with an opposed pair of V-shaped cutting slots 16 for facilitating cutting off the unnecessary part of the lead 12b. The cutting off step is carried out when the assembly of the semiconductor package is finished. The board connection leads 12a and the chip connection leads 12b of the lead frame 12 are horizontally arranged between the opposite side rails 17 and 17' at regular intervals and supported by dambars 18 as shown in FIG. 6.

In the present invention, provision of the V-shaped cutting slots 16 for each of the chip connection leads 12b is achieved by an etching or a mechanical stamping.

The adhesive 13 is preferably selected from an insulating double-faced tape and an insulating adhesive of the paste type and polyimide based tapes and epoxy based tapes. When a thermosetting material is used as the adhesive 13, it is preferred to cure the adhesive 13 attaching the chip 11 to the surfaces of board connection leads 12a in an oven. However, when a thermoplastic material is used as the adhesive 13, the adhesive 13 are preferably cured at a high temperature ranged from 175° to 450° C.

In order to prepare the semiconductor package having the construction described above, a die bonding step is first carried out to bond the semiconductor chip 11 to the surfaces of the board connection leads 12a of the lead frame. In the die bonding step, the semiconductor chip 11 is attached to the surfaces of the board connection leads 12a of the lead frame using the adhesive 13, such as an insulating double-faced tape. Here, the lead frame 12 has no conventional paddle but comprises the plurality of board connection leads 12a and the plurality of chip connection leads 12b, both leads 12a and 12b being arranged at regular intervals between the opposite side rails 17 and 17' as shown in FIG. 6. The die boding step is followed by a curing step carried out at a predetermined temperature for curing the adhesive 13 attaching the semiconductor chip 11 to the surfaces of the board connection leads 12a.

Thereafter, a wire bonding step is carried out to electrically connect the chip connection leads 12b of the lead frame to individual bond pads of the semiconductor chip 11 using metal wires 14, such as gold wires or aluminum wires.

Upon finishing the wire bonding step, a molding step is carried out to hermetically seal the predetermined volume, including the semiconductor chip 11 and the leads 12a and 12b of the lead frame 12, by the mold resin 15 such that the lower surfaces of the board connection leads 12a are leveled with the lower surface of the mold resin 15 and exposed to the outside of the lower surface of the mold resin 15, thus forming the package body.

The molding step is followed by a trimming step for cutting the V-shaped slots 16 of the chip connection leads 12b for cutting off the unnecessary parts of the leads 12b and for providing the desired semiconductor package of the present invention.

In the preparation process of the package of this invention, the remnant of the mold resin 15 is removed from the package body, especially from the lower surface of the package body, by a conventional mechanical abrasive blasting or by a conventional chemical treatment. As a result of the remnant removal from the lower surface of the package body, the lower surfaces of the board connection leads 12a of the lead frame are exposed to the outside of lower surface of the package body.

The resultant semiconductor package is, thereafter, inserted in a tray or in a tube to be subjected to an electric performance test. The semiconductor package on the electric performance test is mounted on a printed circuit board by surface mounting technique to be practically used.

As described above, the semiconductor package of the present invention removes the metal paddle from the lead frame and, as a result, prevents breakage of the package body during its mounting on a circuit board due to difference in thermal expansion coefficient between the semiconductor chip and the metal paddle. The semiconductor package of this invention has a plurality of board connection leads of which the lower surfaces are exposed to the outside of the lower surface of the package body. Hence, this semiconductor package requires minimum mounting area of the printed circuit board and prevents undesirable bending of its leads during its mounting on the circuit board or its transportation.

In addition, the semiconductor package of this invention has no outer leads to be bent in a desired bent shape, thus requiring no forming step in its preparation process. In this regard, the preparation process of this semiconductor package is remarkably simplified, thus reducing the manufacturing cost of the packages as well as the installation cost of the package manufacturing equipment. Furthermore, the package of this invention make it possible to use a probe tip in testing its electric performance, so that it prevents the lead contact deterioration in the electric performance test and this achieves a desired precise testing results.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A resin molded semiconductor package comprising:
   a semiconductor chip having a plurality of bond pads and a lower surface;
   a lead frame comprising a plurality of board connection leads having upper surfaces and lower surfaces, and a plurality of chip connection leads having horizontally flat upper surfaces, said lower surfaces of said board connection leads electrically contacting metal patterns of a printed circuit board and said upper surfaces of said board connection leads supporting said semiconductor chip which is bonded to said upper surfaces of said board connection leads, said chip connection leads extending from individual board connection leads and being electrically connected to said semiconductor chip through a plurality of metal wires, with the horizontally flat upper surfaces of said chip connection leads being positioned above the lower surface of said semiconductor chip;
   an adhesive for bonding said semiconductor chip to the upper surfaces of said board connection leads;
   said plurality of metal wires electrically connecting a plurality of bond pads of said semiconductor chip to the horizontally flat upper surfaces of said chip connection leads of said lead frame, respectively; and
   a mold resin hermetically sealing a predetermined volume of said molded semiconductor package, including said semiconductor chip, said board connection leads and said chip connection leads, to form a molded semiconductor package body having a lower surface wherein the lower surfaces of said board connection leads are exposed at the lower surface of said molded semiconductor package body.

2. A resin molded semiconductor package according to claim 1, wherein said adhesive is an insulating double-faced tape.

3. A resin molded semiconductor package according to claim 1, wherein said adhesive is an insulating paste adhesive.

4. A resin molded semiconductor package according to claim 1, wherein said adhesive is a polyimide based adhesive tape.

5. A resin molded semiconductor package according to claim 1, wherein said adhesive is an epoxy based adhesive tape.

6. A resin molded semiconductor package comprising:

a semiconductor chip having a plurality of bond pads and a lower surface;

a lead frame comprising a plurality of board connection leads having upper surfaces and lower surfaces, and a plurality of chip connection leads having horizontally flat upper surfaces, said lower surfaces of said board connection leads electrically contacting metal patterns of a printed circuit board and said upper surfaces of said board connection leads supporting said semiconductor chip which is bonded to said upper surfaces of said board connection leads, said chip connection leads extending from individual board connection leads and being electrically connected to said semiconductor chip through a plurality of metal wires, with the horizontally flat upper surfaces of said chip connection leads being positioned above the lower surface of said semiconductor chip;

an adhesive for bonding said semiconductor chip to the upper surfaces of said board connection leads;

said plurality of metal wires electrically connecting a plurality of bond pads of said semiconductor chip to the horizontally flat upper surfaces of said chip connection leads of said lead frame, respectively; and a mold resin hermetically sealing a predetermined volume of said molded semiconductor package, including said semiconductor chip, said board connection leads and said chip connection leads, to form a molded semiconductor package body having a lower surface wherein the lower surfaces of said board connection leads are exposed at the lower surface of said molded semiconductor package body, and said semiconductor package also having a side surface wherein said surfaces of said chip connection leads are exposed.

7. A resin molded semiconductor package according to claim 6, wherein said adhesive is an insulating double-faced tape.

8. A resin molded semiconductor package according to claim 6, wherein said adhesive is an insulating paste adhesive.

9. A resin molded semiconductor package according to claim 6, wherein said adhesive is a polyimide based adhesive tape.

10. A resin molded semiconductor package according to claim 6, wherein said adhesive is an epoxy based adhesive tape.

* * * * *